United States Patent

Martinez et al.

(10) Patent No.: US 6,858,517 B2
(45) Date of Patent: Feb. 22, 2005

(54) METHODS OF PRODUCING A HETEROGENEOUS SEMICONDUCTOR STRUCTURE

(75) Inventors: Muriel Martinez, St. Egreve (FR); Alice Boussagol, Brignoud (FR)

(73) Assignee: S.O.I. Tec Silicon on Insulator Technologies S.A., Bernin (FR)

( * ) Notice: Subject to any disclaimer, the term of this patent is extended or adjusted under 35 U.S.C. 154(b) by 17 days.

(21) Appl. No.: 10/839,131

(22) Filed: May 6, 2004

(65) Prior Publication Data

US 2004/0253795 A1 Dec. 16, 2004

Related U.S. Application Data

(60) Provisional application No. 60/494,039, filed on Aug. 8, 2003.

(30) Foreign Application Priority Data

Jun. 11, 2003 (FR) .............................. 03 07027

(51) Int. Cl.⁷ ..................... H01L 21/30; H01L 21/46
(52) U.S. Cl. ..................................... 438/455; 438/458
(58) Field of Search ................... 438/455, 458, 438/800

(56) References Cited

U.S. PATENT DOCUMENTS

| | | | |
|---|---|---|---|
| 5,391,257 A | * | 2/1995 | Sullivan et al. ............. 438/458 |
| 5,395,788 A | | 3/1995 | Abe et al. ..................... 437/61 |
| 5,863,830 A | | 1/1999 | Bruel et al. .................. 438/478 |
| 6,429,094 B1 | * | 8/2002 | Maleville et al. ............ 438/455 |
| 6,774,010 B2 | * | 8/2004 | Chu et al. ..................... 438/458 |
| 2001/0019153 A1 | | 9/2001 | Sato et al. .................... 257/347 |
| 2001/0026997 A1 | * | 10/2001 | Henley et al. ............... 438/458 |
| 2002/0157790 A1 | | 10/2002 | Abe et al. ..................... 156/334 |
| 2003/0022463 A1 | * | 1/2003 | Zheng .......................... 438/459 |
| 2003/0104678 A1 | * | 6/2003 | Kelly et al. .................. 438/458 |
| 2003/0129780 A1 | * | 7/2003 | Auberton-Herve ........... 438/46 |
| 2004/0121557 A1 | * | 6/2004 | Ghyselen ..................... 438/455 |
| 2004/0121558 A1 | * | 6/2004 | Letertre et al. ............. 438/459 |
| 2004/0166649 A1 | * | 8/2004 | Bressot et al. .............. 438/455 |

FOREIGN PATENT DOCUMENTS

| | | |
|---|---|---|
| EP | 0 703 609 A1 | 3/1996 |
| EP | 0 767 486 A2 | 4/1997 |
| EP | 1 189 285 A1 | 3/2002 |

* cited by examiner

*Primary Examiner*—Alexander Ghyka
(74) *Attorney, Agent, or Firm*—Winston & Strawn LLP

(57) ABSTRACT

The present invention relates to a method for forming a heterogeneous assembly of first and second materials having different coefficients of thermal expansion. The method includes bonding a surface of a first substrate of a first material to a surface of a second substrate of a second material wherein the first substrate includes a zone of weakness therein to define a transfer layer adjacent the first surface, providing a stiffening substrate of a third material to maintain sufficient flatness and prevent breakage of the transfer layer during detachment from the first substrate, and detaching the transfer layer from the first substrate along the zone of weakness to form a heterogeneous assembly of the transfer layer and second substrate. The stiffening substrate is bonded to one of the first or second substrates and the third material has a coefficient of thermal expansion that is the same as or close to that of the material of the substrate to which the stiffening substrate is bonded to facilitate a successful detachment of the transfer layer from the first substrate.

19 Claims, 2 Drawing Sheets

METHODS OF PRODUCING A HETEROGENEOUS SEMICONDUCTOR STRUCTURE

CROSS-REFERENCE TO RELATED APPLICATIONS

This application claims the benefit of U.S. provisional application 60/494,039 filed Aug. 8, 2003.

BACKGROUND ART

The invention generally relates to the field of heterogeneous structures. In particular, the invention pertains to methods of forming an assembly that includes a layer of a first material having a first coefficient of thermal expansion on a second substrate of a second material having a different second coefficient of thermal expansion. These methods are useful in forming semiconductor assemblies.

A known structure having two substrates with different coefficients of thermal expansion is shown in FIG. 1. The structure includes a substrate 12 with a first coefficient of thermal expansion and a film or layer 15 having a second coefficient of thermal expansion. A quartz-on-silicon system, which can be used in optical applications such as in the production of displays, is one example of such a structure. Silicon has a coefficient of thermal expansion of $3.59 \times 10^{-6}$/C., and that of quartz is $6 \times 10^{-7}$/C. Other examples are silicon-on-sapphire, silicon-on-glass, silicon carbide-on-glass, germanium-on-glass, or germanium-on-silicon structures.

When two substrates are assembled with different coefficients of thermal expansion, for example, having differences of at least 10% or 20% at ambient temperature (20° C.), or during any subsequent treatment of two assembled substrates, temperature increase stages may take place, for example, in order to strengthen the bonding interface. When the thickness of the substrates is comparable, substantially identical or close to each other and when they behave as thin layers, variations in the behavior of one of the two surfaces with respect to the other can then result in at least one of the two substrates breaking due to a stress release phenomenon. This can occur when the temperature reaches a few hundred degrees (for example a temperature in the range of about 200° C. to about 600° C.).

In general, variations in temperature, for example in the range of about 200° C. to about 600° C., can cause stresses due to differences in the coefficient of thermal expansion. These temperature variations can also cause delamination or detachment of the substrates or layers that are present, and/or plastic deformation and/or fractures and/or breakage of one or more of the substrates or layers. Thus, it would be beneficial to have a method for providing such structures that avoid these problems during phases in which the temperature is changed.

A variety of techniques are known and currently used to produce structures such as those shown in FIG. 1.

A first technique shown in FIG. 2 uses ion implantation into a substrate 10 to form a weakened thin layer 13 which extends substantially parallel to the surface 16 of the substrate 10. The weakened thin layer defines a transfer layer 15 that will be transferred onto the second substrate. The thickness of each of the two substrates 10 and 12 are comparable or close (i.e., within ±10 to 15%). The substrates are then assembled with face 16 against face 18 using a wafer bonding (or direct contact) technique. The specific techniques used for bonding the substrates include adhesive bonding, molecular bonding, or anodic bonding.

Pre-annealing is then carried out at a given temperature and with a limited thermal budget that is lower than the budget that can produce thermal fracturing of the substrate 10. The thermal budget is the product of the duration of the heat treatment and the temperature of the heat treatment. The conditions employed therefore do not cause thermal fracturing of the substrate 10. The substrate 10 is then detached mechanically, for example by using a blade which provides the necessary additional energy.

Another technique involves mechanically and/or chemically thinning the substrate 10 after bonding the two substrates. Mechanical thinning is carried out by lapping and polishing. Chemical thinning involves the use of a substance such as TMAH (tetramethylammonium hydroxide). These two techniques do not allow the portion 14 that is removed from the substrate 10 to be recovered and re-used.

In a further technique, an anodic deposit can be formed on a substrate, for example a glass substrate, which is used as an anode. In this case, bonding occurs at a given temperature which permits the transfer process to be activated at temperatures lower than those required for molecular bonding. Such operation eliminates thermal stress in the layers.

The three techniques described above suffer from some major disadvantages. First, such methods are complicated and thus increase costs. Second, these methods do not produce layers of sufficient quality.

It would be beneficial to be able to easily produce a thin film from a first substrate on a second substrate, wherein the thin film has a thickness in the range of about 50 nanometers (nm) to about 500 nm thick, for example, and wherein the two substrates have coefficients of thermal expansion that differ by about 10% or more. Such a method could be used to produce structures such as silicon-on-quartz, silicon-on-glass, or silicon-on-sapphire, germanium-on-silicon, germanium-on-glass, or silicon carbide (SiC)-on-quartz or silicon carbide-on-glass type assemblies. The present invention now provides the skilled artisan with the ability to produce these materials.

SUMMARY OF THE INVENTION

The present invention relates to a method for forming a heterogeneous assembly of first and second materials having different coefficients of thermal expansion. The method includes bonding a surface of a first substrate of a first material to a surface of a second substrate of a second material wherein the first substrate includes a zone of weakness therein to define a transfer layer adjacent the first surface, providing a stiffening substrate of a third material to maintain sufficient flatness and prevent breakage of the transfer layer during detachment from the first substrate, and detaching the transfer layer from the first substrate along the zone of weakness to form a heterogeneous assembly of the transfer layer and second substrate. The stiffening substrate is bonded to one of the first or second substrates and the third material has a coefficient of thermal expansion that is the same as or close to that of the material of the substrate to which the stiffening substrate is bonded to facilitate a successful detachment of the transfer layer from the first substrate.

Preferably, the stiffening substrate is bonded to the first or second substrate prior to bonding the first substrate to the second substrate, and then is detached after detaching the transfer layer from the first substrate to form the assembly. The zone of weakness can be provided by any conventional way, such as by implanting atomic species, implanting ionic species, or forming a layer of a porous material. Other ways to form this zone can be used as well. The transfer layer is conveniently detached by heat treating the assembly to a temperature of about 250° C. to about 600° C.

The first and second substrates can be joined by any type of bonding, including by adhesive bonding or molecular bonding. It is often desirable to strengthen the bond between the first and second substrates by heating the assembly in steps after bonding the first and second substrates together.

The method further contemplates forming at least one intermediate layer between the first and second materials before bonding the first substrate to the second substrate. The at least one intermediate layer is preferably formed (a) between the surface of the transfer layer and the first material prior to joining that surface to the second substrate, (b) adjacent the surface of the second substrate prior to joining that surface to the first substrate, or (c) both (a) and (b).

Preferably, the first substrate has a thickness of about 500 micrometers ($\mu$m) to about 800 $\mu$m, the transfer layer has a thickness of about 50 nanometers (nm) to about 500 nm, the second substrate has a thickness of about 500 $\mu$m to about 800 $\mu$m, and the stiffening substrate has a thickness of about 700 $\mu$m to about 1200 $\mu$m. The first substrate is advantageously used as a source of additional transfer layers. When the stiffening substrate is bonded to the second substrate, the second and stiffening substrates have a combined thickness that is greater than that of the first substrate, and preferably at a ratio of about 1.2:1 to about 5:1. When the stiffening substrate is bonded to the first substrate, the first and stiffening substrates also have a combined thickness that is greater than that of the second substrate, but preferably at a ratio of about 2:1 to about 6.5:1. For example, when the first material is silicon, the second material is quartz, and the third material is quartz, and the stiffening substrate is bonded to the second substrate, the total thickness of the second and stiffening substrates can be in the range 1800 $\mu$m to 2500 $\mu$m.

The method is advantageously applicable to process substrates at least one of the substrates is formed from a semiconductor material. The use of a stiffening substrate on the first or second substrate substantially reduces the curvature or deformations caused by differences in the coefficients of thermal expansion between the first and the second substrates. In particular, a curvature may occur due to a rise in temperature that is used to detach the two substrates, or that is used to improve the quality of the bond between the first substrate and the second substrate. The method can be used to advantageously realize assemblies such as a silicon-on-quartz assembly, or a silicon-on-glass assembly, or a silicon-on-sapphire assembly, or a germanium-on-silicon assembly, or a germanium-on-glass assembly, or a silicon carbide-on-quartz assembly, or a silicon carbide-on-glass assembly.

BRIEF DESCRIPTION OF THE DRAWINGS

Other aspects and advantages of the present invention will become clear from reading the following detailed description of the preferred embodiments of the invention, given by way of example and with reference to the appended drawings, in which.

DETAILED DESCRIPTION OF THE PREFERRED EMBODIMENTS

Figure 3A:
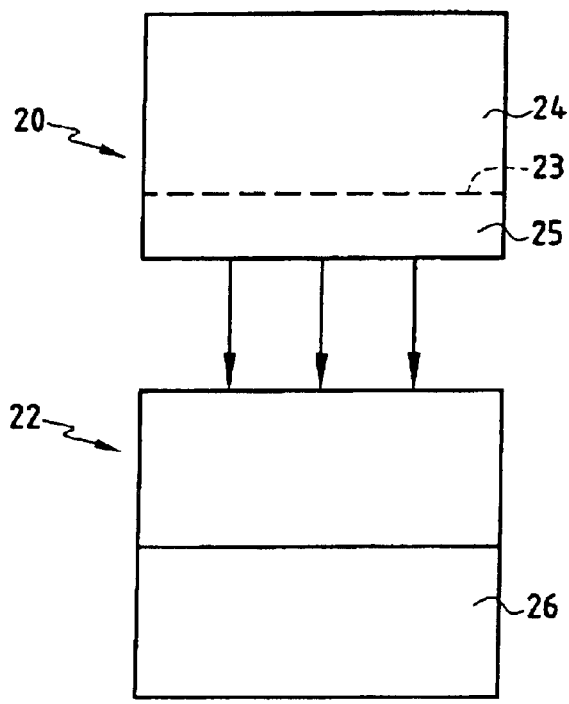
FIGS. 3A to 3C illustrate an implementation of the method according to the invention.
Figure 3B:
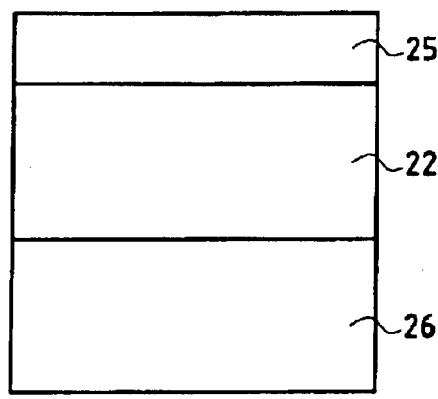
Figure 3C:
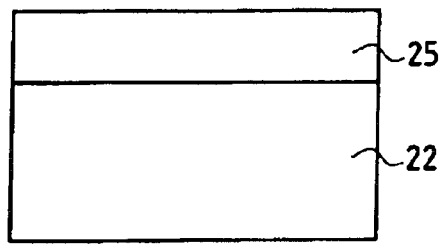

A first example of an implementation of the present method is illustrated by FIGS. 3A to 3C. In FIG. 3A, a first substrate 20 is formed from a first material, and a second substrate 22 having a thickness in the range from about 500 $\mu$m to about 1200 $\mu$m is formed from a second material. The second substrate has a coefficient of thermal expansion that is different that that of the first substrate. For example, at ambient temperature the relative difference between the two coefficients of thermal expansion is at least about 10% but can be about 20% or even more.

In one example, the first substrate is formed from silicon and the second substrate is formed from quartz. It is also possible to have a silicon-sapphire or silicon-glass type assembly.

In a first step (FIG. 3A), atomic or ionic implantation is carried out on the substrate 20 to form a zone of weakness 23 or fracture zone. The volume of the substrate 20 is thus separated into a lower region 25 (with a thickness in the range of about 50 nm to about 500 nm) and an upper region 24 that makes up the bulk of the substrate 20. The lower region 25 constitutes a transfer layer to be formed on the material 22.

In general, atomic species of hydrogen are preferably implanted to form the zone of weakness, but other species or a combination of species such as hydrogen/helium can also be implanted. A fracture zone, or fracture layer, or plane of weakness, or zone of weakness 23 can also be produced by forming a porous layer as described in the article by K. Sataguchi et al "ELTRAN by Splitting Porous Si Layers", Proceedings of the $9^{th}$ Int. Symposium on Silicon-on-Insulator Tech. and Device, 99-3, The Electrochemical Society, Seattle, pages 117–121 (1999).

After the preparations described above, the two substrates 20 and 22 are assembled together with surface or face 21 against surface or face 27. A wafer bonding technique is used wherein the wafers are bonded by any technique that is known in the microelectronics field. For example, the wafers may be bonded by adhesive contact, by molecular bonding, by utilizing a chemical preparation method (for example, one of the two surfaces is activated to render it hydrophilic or hydrophobic), or by activating at least one of the surfaces by polishing. The two substrates are simply brought into contact with mechanical assistance to initiate adhesion. Such techniques have been described, for example, in the work by Q. Y. Tong and U. Gösele, "Semiconductor Wafer Bonding", (Science and Technology), Wiley Interscience Publications.

The substrate 22 is then brought into contact and assembled with the substrate 26. Assembly may take place, for example, by molecular bonding or by use of an adhesive. The thickness of the substrate 26 is such that the sum of the thicknesses of the substrates 22 and 26 is greater than the thickness of the substrate 20.

Advantageously, the thickness of the combined substrates to the thickness of the substrate that contains the layer to be transferred is at a ratio of about 1.2:1 to about 5:1 and preferably is about 2:1 to about 3:1.

The coefficient of thermal expansion of the substrate 26 is close to that of the substrate 22; which means that the relative difference between their coefficients of thermal expansion is less than 10% at ambient temperature. In one example, the substrate 26 and the substrate 22 are both formed from quartz. After assembling the substrates 20 and 22 together, the portion 24 of the substrate 20 is detached by, for example, using a heat treatment and/or by applying a mechanical stress (a blade or a pressurized water jet) to cause fracturing along the plane or zone of weakness 23. The heat treatment may cause a temperature rise to a temperature in the range of about 350° C. to about 500° C. or about 650° C., for example. The substrate 26 acts as a counter-plate to keep the assembly flat and thus prevents curvature of the two substrates 20 and 22. The substrate 26 thus prevents the substrates 20 and 22 from curling as the temperature rises despite the differences between the coefficients of thermal expansion of the substrate 20 and the substrate 22, and despite the fact that the transfer layer 25 then absorbs more stresses than it would in the absence of the quartz counter-plate 26.

In the absence of the substrate 26, there is a risk that the transfer layer 25 may break during detachment and transfer to the substrate 22 because the two substrates 20 and 22 are initially of a comparable thickness and have different coefficients of thermal expansion. Further, there would be a risk that the bonding interface between the two substrates 20 and 22 may separate or break due to the stress and deformation that would be induced because of the differences in the coefficients of thermal expansion. These risks are mitigated by the presence of the substrate 26, despite the presence of even higher stresses in the substrate 22 and/or the transfer layer 25. The resulting assembly or structure is shown in FIG. 3B.

In FIG. 3C, the substrate 26 is detached or separated from the assembly of the transfer layer 25 formed on the substrate 22. If substrates 26 and 22 have been assembled by molecular bonding, they can be separated by inserting a blade at the interface between the two substrates. It they are bonded with an adhesive, then a solvent can be used to separate them.

The portion 24 of the substrate 20 can be recovered and re-used, even though the initial structure is heterogeneous. Further, the transfer layer 25 has qualities (for example, the absence of a sliding plane or dislocation plane in the material) that are better than those of layers obtained by the known techniques described above. In accordance with the invention, to obtain such structures, it is possible to utilize a "SMART-CUT®" technique.

In a variation, the transfer layer 25 includes a thin oxide layer at its surface.

For example, such an oxide layer may have a thickness in the range of about 50 nm to about 400 nm. The function of the substrate 26 in this case remains similar to that described above. More generally, there may be one or more intermediate layers inserted between the substrates 20 and 22, wherein the intermediate layers may be on the substrate 20 or on the substrate 22.

Figure 1:
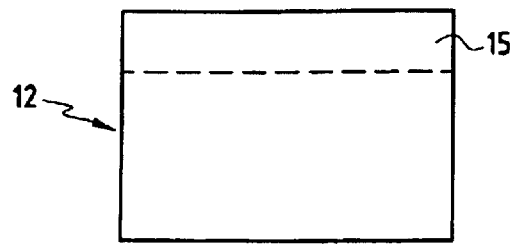
FIG. 1 shows a known heterogeneous structure.
Figure 2:
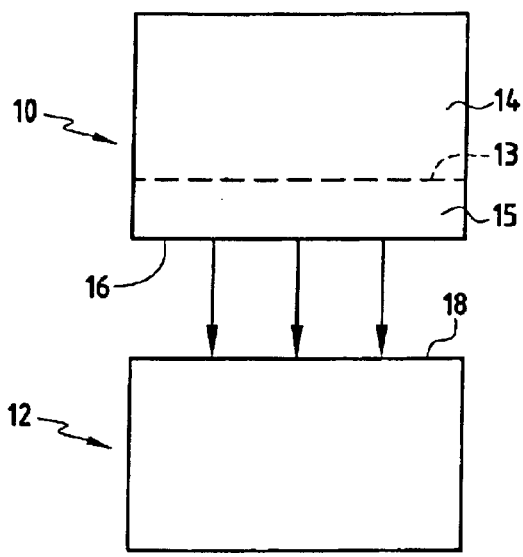
FIG. 2 shows a known technique for producing a layer on a substrate, using a substrate fracturing method.
Figure 4:
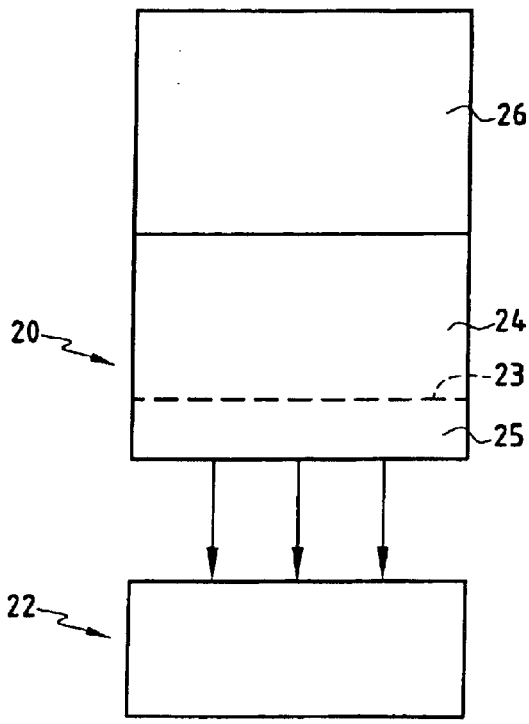
FIG. 4 shows a variation of the implementation of FIGS. 3A–3C according to the invention.

FIG. 4 shows a variation of the present method in which the substrate 26 is positioned (for example by molecular bonding or using an adhesive) on the substrate 20 prior to assembly with the substrate 22. Here again, the substrate 26 functions to prevent expansion and deformations due to differences in the coefficients of thermal expansion between the substrates 20 and 22. The sum of the thicknesses of substrates 26 and 20 is greater than or and preferably is substantially greater than that of the substrate 22. The thickness of the combined substrates to the thickness of the substrate that is to receive the transfer layer is generally at a ratio of about 2:1 to about 6.5:1 and preferably is about 2.5:1 to about 5:1. The coefficients of thermal expansion of substrates 20 and 26 are close to each other as explained above (that is, the relative difference is less than about 10%).

After detaching the transfer layer 25 at the plane of fracture or zone of weakness 23 from the substrate 20 as described above, the substrate 26 and the remaining portion 24 of the substrate 20 are withdrawn. The result is a structure identical to that of FIG. 3C.

In a variation, the substrate 26 has a coefficient of expansion that is identical to that of the substrate 20. For example, in the case of a silicon (substrate 20)-sapphire (substrate 22) assembly, a substrate 26 with a coefficient of thermal expansion identical to that of silicon is used. The substrate 26 is itself a substrate formed from silicon, for example, and is deposited as shown on the side of substrate 20.

In the case of the first implementation (FIG. 3A), using the plate (wafer) 26 makes it possible to employ a substrate 22 having a thickness that is smaller than the usual thickness.

When conventional methods are utilized, a quartz substrate having a thickness of about 800 μm or less will break during heat treatment while transfer of the transfer layer from the source substrate is taking place. Therefore, substrates with a thickness of substantially 1000 μm or more must be used. In contrast, the present invention allows the use of thinner substrates. For example, the substrate 22 may be less than about 800 μm thick, and in particular may be in the range of about 500 μm to about 800 μm thick. In a particular example, a quartz substrate 22 could be used having a thickness of 525 μm and it will not break during transfer of the transfer layer 25.

What is claimed is:

1. A method for forming a heterogeneous assembly, which comprises:

bonding a surface of a first substrate to a surface of a second substrate, wherein the first substrate includes a zone of weakness therein to define a transfer layer adjacent the first surface, and the first and second substrates made of first and second materials, respectively, with the first material having a different coefficient of thermal expansion than the second material;

providing a stiffening substrate of a third material to maintain sufficient flatness and prevent breakage of the transfer layer during detachment from the first substrate, with the stiffening substrate being bonded to one of the first or second substrates and the third material having a coefficient of thermal expansion that is the same as or close to that of the material of the substrate to which the stiffening substrate is bonded; and detaching the transfer layer from the first substrate along the zone of weakness to form a heterogeneous assembly of the transfer layer and second substrate.

2. The method of claim 1 wherein the stiffening substrate is bonded to the first or second substrate prior to bonding the first substrate to the second substrate.

3. The method of claim 1 further comprising detaching the stiffening substrate after detaching the transfer layer from the first substrate.

4. The method of claim 1 wherein the zone of weakness is provided by implanting atomic species, implanting ionic species, or forming a layer of a porous material.

5. The method of claim 4 wherein the zone of weakness is formed by atomic or ionic implantation and the implanted ions are hydrogen ions or a mixture of hydrogen ions and helium ions.

6. The method claim 1 wherein the transfer layer is detached by heat treating the assembly to a temperature of about 250° C. to about 600° C.

7. The method of claim 1 wherein the first and second substrates are joined by adhesive bonding or molecular bonding.

8. The method of claim 1 which further comprises strengthening the bond between the first and second substrates by heating the assembly in steps after bonding the first and second substrates together.

9. The method of claim 1 wherein the first substrate has a thickness of about 500 μm to about 800 μm, the transfer layer has a thickness of about 50 nm to about 500 nm, the second substrate has a thickness of about 500 μm to about 800 μm, and the stiffening substrate has a thickness of about 700 μm to about 1200 μm.

10. The method of claim 1 wherein the stiffening substrate is bonded to the second substrate and the second and stiffening substrates have a combined thickness that is greater than that of the first substrate.

11. The method of claim 1 wherein the stiffening substrate is bonded to the second substrate and the second and stiffening substrates have a combined thickness relative to the first substrate that provide a ratio of about 1.2:1 to about 5:1.

12. The method of claim 1 wherein the stiffening substrate is bonded to the first substrate and the first and stiffening substrates have a combined thickness that is greater than that of the second substrate.

13. The method of claim 1 wherein the stiffening substrate is bonded to the first substrate and the first and stiffening substrates have a combined thickness relative to the second substrate that provide a ratio of about 2:1 to about 6.5:1.

14. The method of claim 1 wherein at least one of the substrates is formed from a semiconductor material.

15. The method of claim 1 wherein the resulting assembly is a silicon-on-quartz assembly, or a silicon-on-glass assembly, or a silicon-on-sapphire assembly, or a germanium-on-silicon assembly, or a germanium-on-glass assembly, or a silicon carbide-on-quartz assembly, or a silicon carbide-on-glass assembly.

16. The method of claim 1 wherein the first material is silicon, the second material is quartz, and the third material is quartz.

17. The method of claim 1 which further comprises reusing the first substrate as a source of additional transfer layers.

18. The method of claim 1 further comprising forming at least one intermediate layer between the first and second materials before bonding the first substrate to the second substrate.

19. The method of claim 1 wherein the at least one intermediate layer is formed (a) between the surface of the transfer layer and the first material prior to joining that surface to the second substrate, (b) adjacent the surface of the second substrate prior to joining that surface to the first substrate, or (c) both (a) and (b).

* * * * *